United States Patent
Takakuwa

(10) Patent No.: US 9,240,336 B2
(45) Date of Patent: Jan. 19, 2016

(54) IMPRINT METHOD AND IMPRINT APPARATUS

(71) Applicant: Kabushiki Kaisha Toshiba, Minato-ku (JP)

(72) Inventor: Manabu Takakuwa, Suzuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/193,705

(22) Filed: Feb. 28, 2014

(65) Prior Publication Data

US 2015/0170922 A1 Jun. 18, 2015

Related U.S. Application Data

(60) Provisional application No. 61/915,633, filed on Dec. 13, 2013.

(51) Int. Cl.
*H01L 21/67* (2006.01)
*B29C 43/00* (2006.01)
*G03F 7/00* (2006.01)

(52) U.S. Cl.
CPC .......... *H01L 21/67092* (2013.01); *B29C 43/00* (2013.01); *G03F 7/0002* (2013.01)

(58) Field of Classification Search
CPC ................... H01L 21/67034; H01L 21/67173; B29C 33/38; B29C 33/40; B29C 33/56
See application file for complete search history.

(56) References Cited

U.S. PATENT DOCUMENTS

| | | | |
|---|---|---|---|
| 2008/0090170 A1* | 4/2008 | Yoneda | 430/270.1 |
| 2009/0261504 A1 | 10/2009 | Uchida | |
| 2010/0092727 A1* | 4/2010 | Uchida | 428/142 |
| 2011/0228239 A1 | 9/2011 | Gosen et al. | |

FOREIGN PATENT DOCUMENTS

| | | |
|---|---|---|
| JP | 2011-199284 | 10/2011 |
| JP | 2012-49471 | 3/2012 |
| JP | 5004027 | 6/2012 |
| JP | 2013-145879 | 7/2013 |

* cited by examiner

*Primary Examiner* — Kyoung Lee
(74) *Attorney, Agent, or Firm* — Oblon, McClelland, Maier & Neustadt, L.L.P.

(57) ABSTRACT

According to one embodiment, an imprint method is provided. In the imprint method, minute objects adhering to a shot of a substrate, on which imprinting is next performed, are removed after delivering the substrate to the interior of an imprint apparatus and before dropping a resist onto the substrate. Thereafter, a resist is dropped onto the shot. Further, a template that is an original plate having a concave-convex pattern is brought into contact with the resist to form a resist pattern on the substrate according to the concave-convex pattern.

20 Claims, 5 Drawing Sheets

US 9,240,336 B2

IMPRINT METHOD AND IMPRINT APPARATUS

CROSS-REFERENCE TO RELATED APPLICATIONS

This application is based upon and claims the benefit of priority from U.S. Provisional Application No. 61/915,633, filed on Dec. 13, 2013; the entire contents of which are incorporated herein by reference.

FIELD

Embodiments described herein relate generally to an imprint method and an imprint apparatus.

BACKGROUND

There is a case where when particles are generated at an imprinting step in manufacturing a semiconductor device, the particles adhere to a wafer substrate. When an original plate (a template) is pressed against the wafer substrate in this state, the template can be broken or a defect can occur in a circuit pattern in some cases.

Therefore, it is desirable at the imprinting step to press the original plate against the wafer substrate without any particles adhering to the wafer substrate.

DETAILED DESCRIPTION

According to one embodiment, there is provided an imprint method. The imprint method includes removing minute objects adhering to a shot of a substrate, on which imprinting is next performed, after delivering the substrate to an interior of an imprint apparatus and before dropping a resist onto the substrate. Thereafter, a resist is dropped onto the shot. By bringing a template that is an original plate having a concave-convex pattern into contact with the resist, a resist pattern is formed on the substrate according to the concave-convex pattern.

Exemplary embodiments of an imprint method and an imprint apparatus will be explained below in detail with reference to the accompanying drawings. The present invention is not limited to the following embodiments.

(Embodiment)

Figure 1:
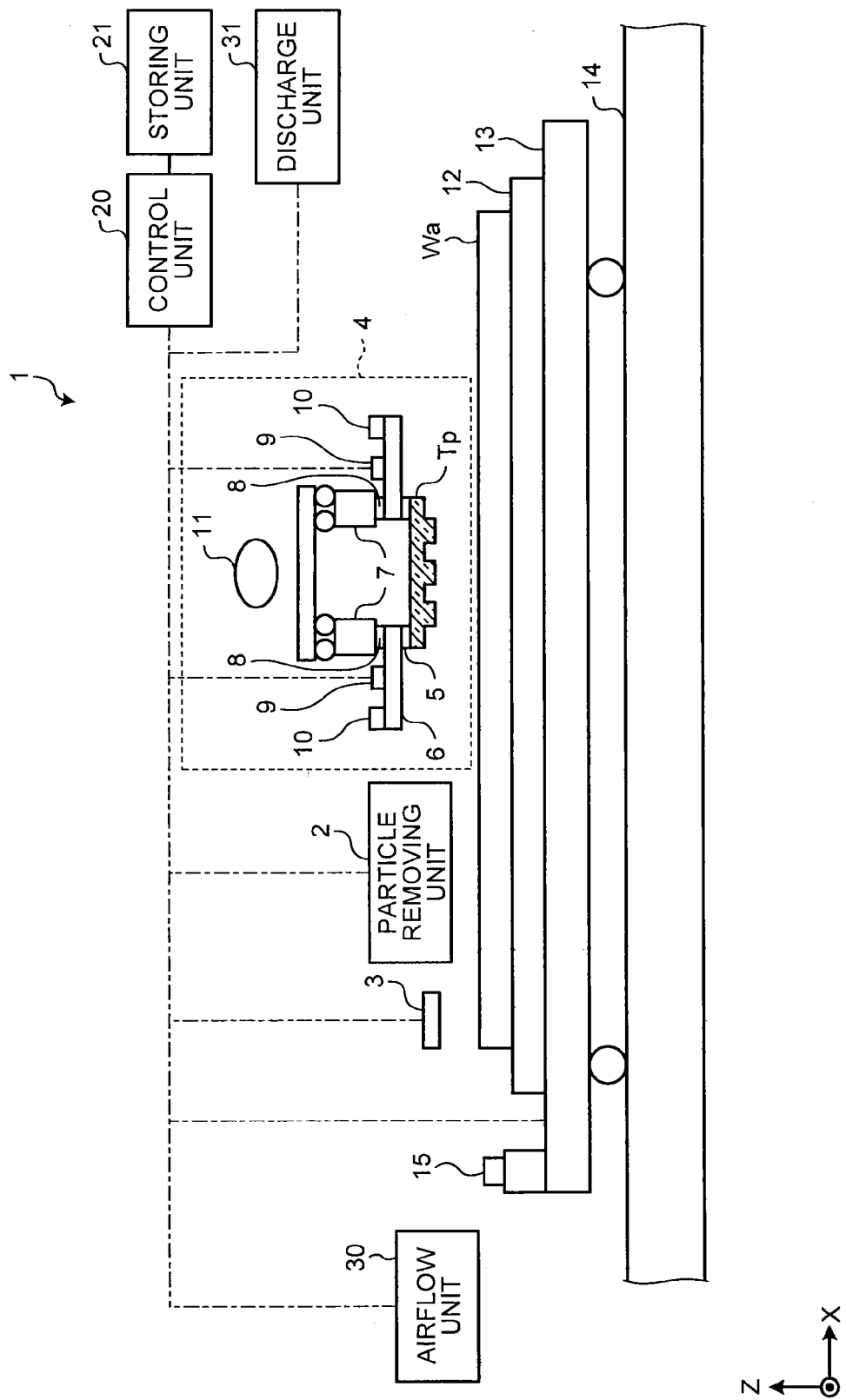
FIG. 1 illustrates a configuration of an imprint apparatus according to an embodiment.

FIG. 1 illustrates a configuration of an imprint apparatus according to an embodiment. An imprint apparatus 1 is a lithographic apparatus that transfers a template pattern of a template (an original plate) Tp that is a mold substrate to a transferred substrate (a machined substrate such as a wafer Wa). The imprint apparatus 1 transfers a template pattern to each shot on the wafer Wa by a step-and-repeat method.

The imprint apparatus 1 according to the present embodiment removes particles (minute objects) on the wafer Wa immediately before an ink-jet (resist application) process. Further, during a period from after removing the particles until imprinting is performed, the imprint apparatus 1 prevents additional particles from adhering to the wafer Wa by using an air curtain or the like.

The imprint apparatus 1 includes a particle removing unit 2, an ink-jet unit (resist dropping unit) 3, an imprint head 4, a chuck 12, a sample stage 13, a stage surface plate 14, a reference mark stand 15, a control unit 20, a storing unit 21, an airflow unit 30, and a discharge unit 31.

The imprint head 4 includes an original-plate stage 5, a base 6, an alignment sensor 7, an alignment stage 8, a correction mechanism 9, a pressurizing unit 10, and a UV light source 11.

The stage surface plate 14 has a main surface in a horizontal direction. The sample stage 13 moves on this main surface. The sample stage 13 places thereon the wafer Wa, and moves within a plane (an XY plane) that is parallel to the wafer Wa placed on the sample stage 13.

The sample stage 13 moves the wafer Wa to below the ink-jet unit 3 when a resist that serves as a transfer material is dropped onto the wafer Wa. The sample stage 13 moves the wafer Wa to below the imprint head 4 when an imprinting process is performed on the wafer Wa. The sample stage 13 moves the wafer Wa to below the particle removing unit 2 before dropping a resist onto the wafer Wa. When the sample stage 13 moves the wafer Wa, the sample stage 13 operates to position the wafer Wa to a target movement position. It is preferable that the sample stage 13 can be driven in six directions in total which are X-axis, Y-axis, and Z-axis directions and the directions about these axes.

The sample stage 13 according to the present embodiment moves the wafer Wa to below the particle removing unit 2, to below the ink-jet unit 3, and to below the imprint head 4 in this order in each shot process of the wafer Wa.

The chuck 12 is provided on the sample stage 13. The chuck 12 fixes the wafer Wa to a predetermined position on the sample stage 13. The reference mark stand 15 is fixed and arranged on the sample stage 13. The reference mark stand 15 includes a reference mark (not shown) for detecting the position of the sample stage 13, and is used for alignment when the wafer Wa is loaded onto the sample stage 13. The reference mark is a mark of a reference position in the imprint apparatus 1, and is configured by a diffraction grating, for example. This reference mark is utilized for calibration of the alignment sensor 7, positioning (attitude control and adjustment) of the template Tp, and the like.

In the imprint head 4, the original-plate stage 5 is provided on a bottom-surface side of the base 6 (on the side of the wafer Wa). The original-plate stage 5 fixes the template Tp at a predetermined position by, for example, vacuum-suctioning the template Tp on its back-surface side (a surface on which the template pattern is not formed). The original-plate stage 5 operates to position the template Tp to the reference position within the imprint apparatus 1.

The template Tp is formed from a member that transmits ultraviolet rays (UV light), such as quartz and fluorite. The template Tp has a concave-convex pattern as the template pattern. A concave portion of the concave-convex pattern is filled with a resist. The concave-convex pattern is a transfer pattern to the wafer Wa, and includes a pattern corresponding to a device pattern (a circuit pattern) formed on the wafer Wa, and a pattern corresponding to an original-plate alignment mark used at the time of aligning the template Tp with the wafer Wa.

On the template Tp, a first alignment mark (the original-plate alignment mark) (not shown) is formed. On the wafer Wa, a second alignment mark (an underlying alignment mark) (not shown) is formed in an underlying pattern that is formed in advance. These underlying alignment mark and original-plate alignment mark are used to measure the relative position misalignment between the template Tp and the wafer Wa. Each of the original-plate alignment mark and the underlying alignment mark is configured by a diffraction grating, for example.

The wafer Wa includes a substrate such as a semiconductor substrate, the underlying pattern that is formed on this substrate, and a machined layer that is formed on this underlying pattern. In the wafer Wa, a resist is dropped onto the machined layer at the time of pattern transfer. The machined layer is an insulating film, a metal film (a conductive film), a semiconductor film, or the like. The resist is a photosensitive photo-curing resin or the like.

The alignment stage 8, the correction mechanism 9, and the pressurizing unit 10 are arranged on the top surface side of the base 6. The alignment sensor 7 is provided on top of the alignment stage 8. The alignment sensor 7 is a sensor that detects the positions of the wafer Wa and the template Tp. The alignment stage 8 performs alignment of the template Tp relative to the wafer Wa based on the positions of the wafer Wa and the template Tp detected by the alignment sensor 7.

The correction mechanism 9 corrects warping and the like of the template Tp based on warping and the like of a lower layer-side pattern formed on the wafer Wa. The pressurizing unit 10 pressurizes the vicinity of the template Tp upon pressing the template pattern of the template Tp against a resist on the wafer Wa.

The UV light source 11 is a light source that irradiates UV light, and is provided above the base 6. The UV light source 11 is fixed to a main-unit surface plate (not shown). The UV light source 11 irradiates UV light from above the template Tp with the template Tp pressed against the resist. Ultraviolet rays emitted from the UV light source 11 are irradiated through the template Tp on a resist applied to a transfer position on the wafer Wa. FIG. 1 illustrates a case where the UV light source 11 is arranged immediately above the template Tp. However, the arrangement position of the UV light source 11 is not limited thereto.

The imprint apparatus 1 moves the imprint head 4 in an up-and-down direction (a vertical direction) to press the template Tp against the resist and to remove (demold) the template Tp from the resist.

The ink-jet unit 3 is a liquid dropping device that drops a resist onto the wafer Wa by an ink-jet method. An ink-jet head (not shown) included in the ink-jet unit 3 includes plural minute holes through which drops of the resist are sprayed. The resist used for imprinting is a photo-curing resin (a photo-curing agent), for example.

The ink-jet unit 3 can have a device configuration that can realize a sequence in which a resist is dropped in two shots simultaneously by one ink-jet nozzle, or can have a device configuration in which two ink-jet nozzles are provided.

The particle removing unit 2 is a device that removes particles on the wafer Wa after loading the wafer Wa onto the sample stage 13 and before dropping a resist onto the wafer Wa. The particle removing unit 2 uses gas, liquid, static electricity, or the like to remove particles on the wafer Wa.

The particle removing unit 2 removes particles on a shot of the wafer Wa, on which imprinting is to be performed. The particle removing unit 2 is arranged between the imprint head 4 and the ink-jet unit 3, for example.

The airflow unit 30 is a device that provides airflow to the wafer Wa. The airflow unit 30 is arranged on the outer side of the ink-jet unit 3, for example. The airflow unit 30 feeds air or the like in a planar direction substantially parallel to the upper surface of the wafer Wa to fill the space above the wafer Wa with the air.

During the period from after removing particles from the wafer Wa until a resist is dropped onto the wafer Wa, the airflow unit 30 provides airflow to the wafer Wa. During the period from after dropping the resist onto the wafer Wa until imprinting the template Tp on the wafer Wa, the airflow unit 30 provides airflow to the wafer Wa.

The discharge unit 31 discharges air when the airflow unit 30 provides airflow. The discharge unit 31 discharges air that has been fed from the airflow unit 30 and used to remove particles on the wafer Wa. The discharge unit 31 is arranged on the opposite side to the airflow unit 30 with respect to the wafer Wa, for example.

The storing unit 21 stores therein a machining program to be used for performing imprinting. The machining program according to the present embodiment includes a removal program for removing particles on the wafer Wa, an airflow program for providing airflow to the wafer Wa, a delivery program for delivering the wafer Wa, and an imprinting program for performing an imprinting process on the wafer Wa.

By using the delivery program, the wafer Wa is delivered to the particle removing unit 2, the ink-jet unit 3, and the imprint head 4 in this order. Further, by using the imprinting program, a process of dropping a resist, a process of imprinting the template Tp, and a process of demolding the template Tp are performed on the wafer Wa.

The control unit 20 is connected to each of constituent elements of the imprint apparatus 1, and uses the machining program stored in the storing unit 21 to control each of the constituent elements. FIG. 1 illustrates a case where the control unit 20 is connected to the airflow unit 30, the discharge unit 31, the sample stage 13, the ink-jet unit 3, the particle removing unit 2, and the correction mechanism 9, and does not illustrate connections of the control unit 20 to other constituent elements. The control unit 20 according to the present embodiment controls the process of dropping a resist, the process of imprinting the template Tp, the process of demolding the template Tp, and other processes.

Figure 2:
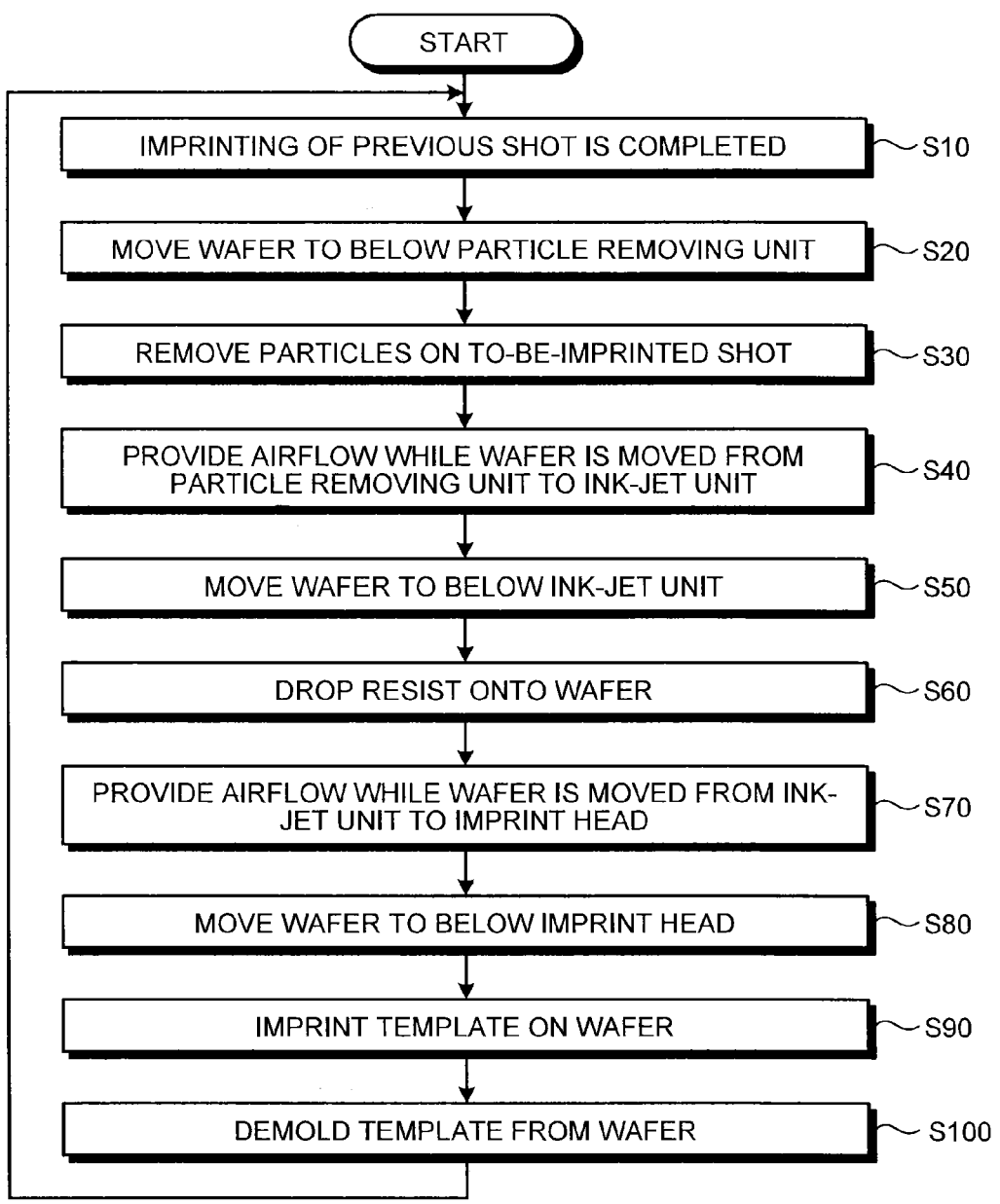
FIG. 2 is a flowchart of a process procedure of an imprint method according to the embodiment.

Next, a procedure of the imprinting process performed by the imprint apparatus 1 is explained. FIG. 2 is a flowchart of a process procedure of an imprint method according to the present embodiment. When the wafer Wa is delivered to the interior of the imprint apparatus 1, the wafer Wa is placed on the sample stage 13. The imprint apparatus 1 then performs imprinting on each shot of the wafer Wa.

In the imprint apparatus 1, when imprinting on the previous shot is completed (Step S10), the sample stage 13 moves the wafer Wa to below the particle removing unit 2 (Step S20).

The particle removing unit 2 removes particles on a to-be-imprinted shot of the wafer Wa (Step S30). The to-be-imprinted shot is a shot onto which a resist is to be dropped and the template Tp is to be imprinted. The particle removing unit 2 uses at least one of air (compressed air or the like), water, chemical solution (alcohol or the like), and static electricity, for example, to remove particles in the unit of shots.

After the particles are removed, the airflow unit 30 provides airflow to the wafer Wa, while the wafer Wa is moved from the particle removing unit 2 to the ink-jet unit 3, in order to keep the wafer Wa in a normal condition (Step S40). The airflow unit 30 sprays, for example, gas that includes at least one of rare gas such as He, $N_2$ (nitrogen), propane-based gas such as 1,1,1,3,3-pentafluoropropane (PFP), and methane-based gas such as 1,1,1,2-tetrafluoromethane (TFE), to the wafer Wa.

The sample stage 13 moves the wafer Wa, from which particles have been removed, to below the ink-jet unit 3 (Step S50). The ink-jet unit 3 drops a resist onto a to-be-imprinted shot of the wafer Wa (Step S60).

After the resist is dropped onto the wafer Wa, the airflow unit 30 provides airflow to the wafer Wa, while the wafer Wa is moved from the ink-jet unit 3 to the imprint head 4 (Step S70).

The sample stage 13 moves the wafer Wa, onto which a resist has been dropped, to below the imprint head 4 (Step S80). The imprint head 4 imprints the template Tp on the wafer Wa, while performing position alignment between the template Tp and the wafer Wa (Step S90).

The imprint head 4 then brings the template Tp into contact with the resist for a predetermined time to fill the resist in the concave portion of the template Tp. Thereafter, the imprint head 4 irradiates UV light from above the template Tp by using the UV light source 11 to cure the resist. After the resist is cured, the imprint head 4 demolds the template Tp from the wafer Wa (Step S100).

In this manner, a transfer pattern corresponding to a template pattern is formed on the resist on the wafer Wa. Thereafter, pattern formation is performed on the next shot. The imprint apparatus 1 performs the processes at Steps S10 to S100 described above on each shot in this order.

When the imprinting process for all shots on the wafer Wa is completed, the wafer Wa is delivered to the exterior of the imprint apparatus 1. Thereafter, the machined layer is etched by using a resist pattern formed on the wafer Wa as a mask, and thus, the transfer pattern is transferred to the machined layer.

Figure 3:
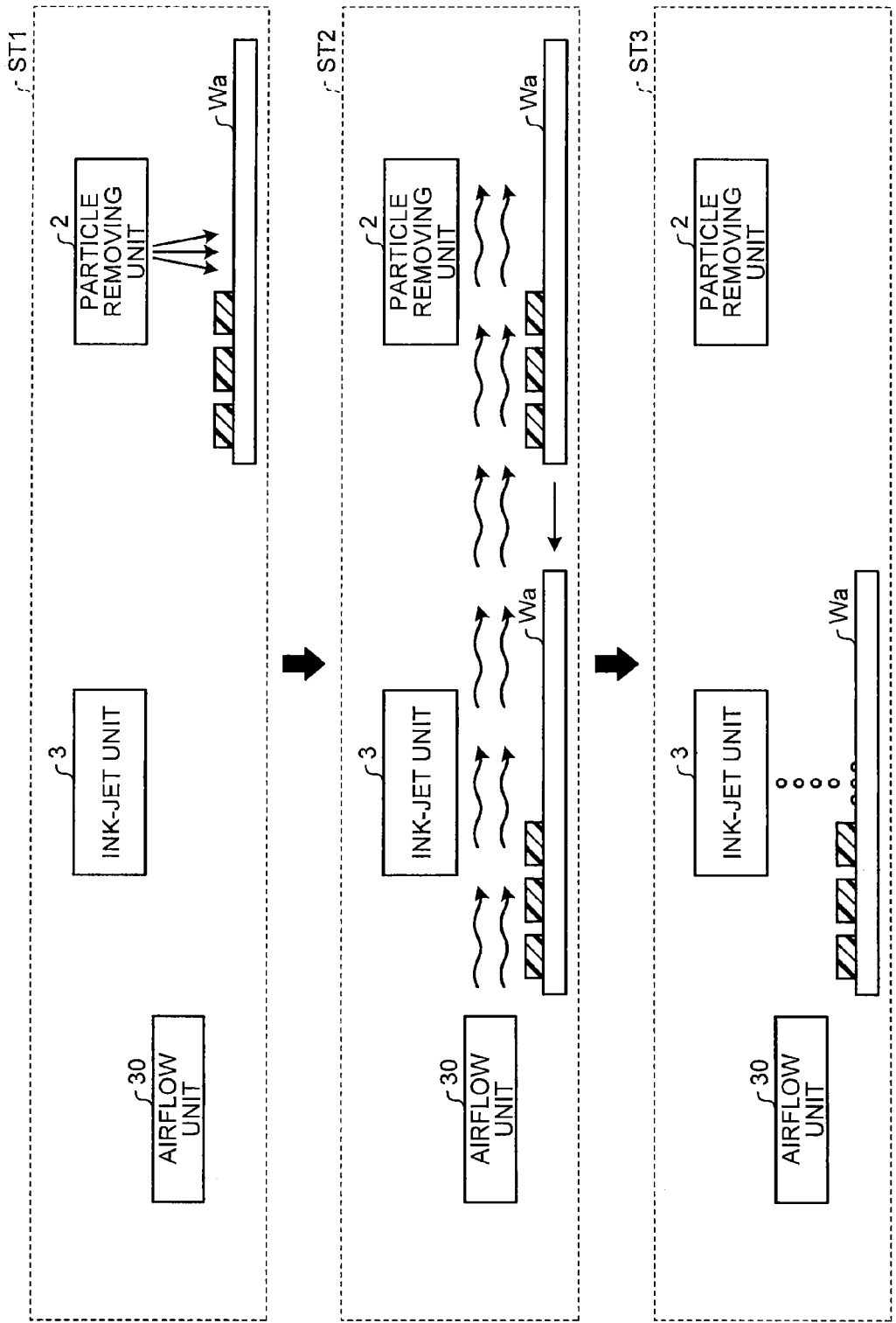
FIG. 3 is an explanatory diagram of processes from removing particles to dropping a resist.

FIG. 3 is an explanatory diagram of the processes from removing particles to dropping a resist. In the imprint apparatus 1, the particle removing unit 2 removes particles on the wafer Wa (ST1).

The airflow unit 30 then starts providing airflow to the wafer Wa. Further, the imprint apparatus 1 moves the wafer Wa to below the ink-jet unit 3, while providing airflow to the wafer Wa (ST2). Thereafter, the airflow unit 30 stops providing airflow to the wafer Wa, and the ink-jet unit 3 drops a resist onto the wafer Wa (ST3). The ink-jet unit 3 can drop a resist onto the wafer Wa while continuously providing airflow by the airflow unit 30.

Figure 4:
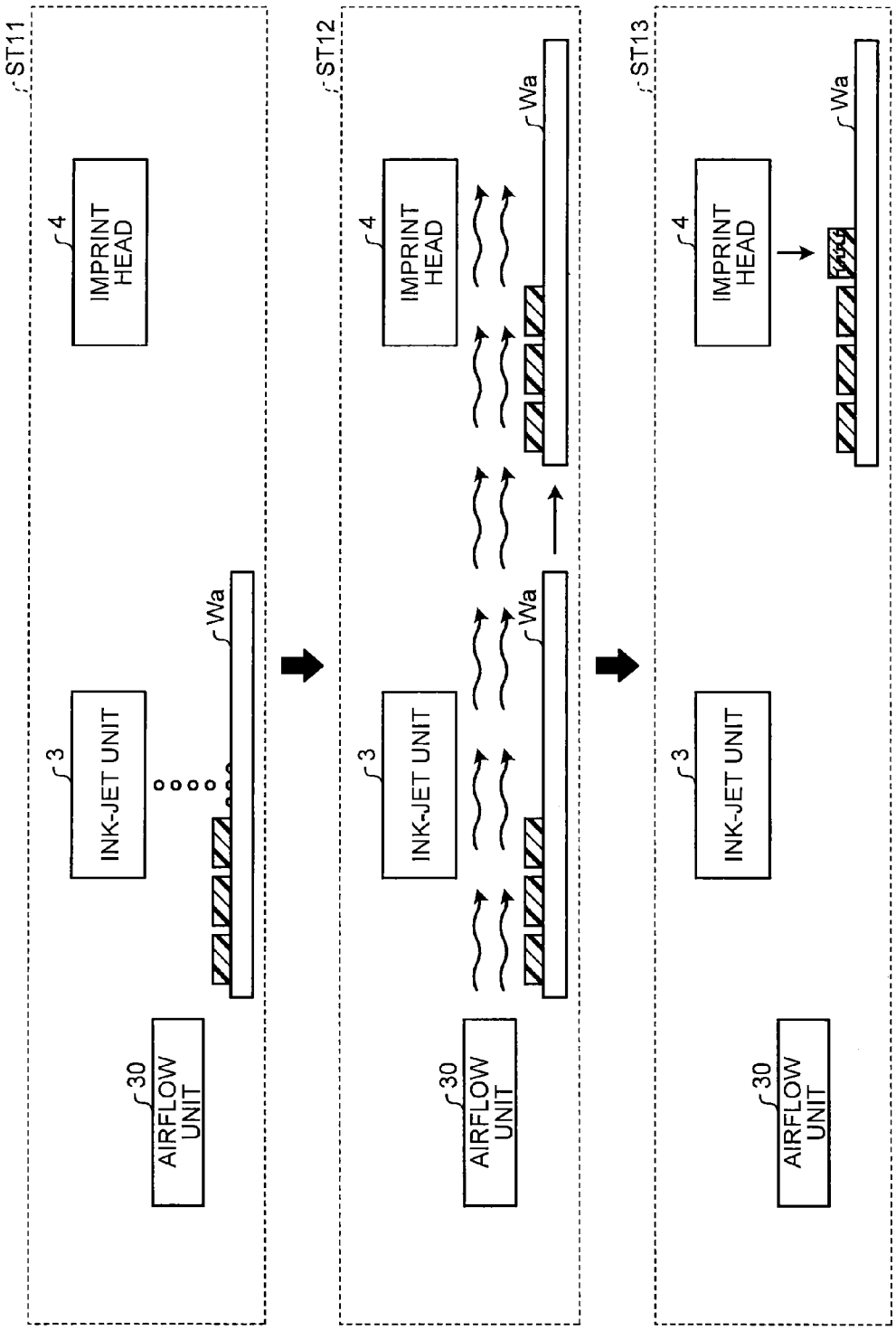
FIG. 4 is an explanatory diagram of processes from dropping a resist to imprinting a template.

FIG. 4 is an explanatory diagram of the processes from dropping a resist to imprinting a template. In the imprint apparatus 1, the ink-jet unit 3 drops a resist onto the wafer Wa (ST11).

When dropping of the resist onto the wafer Wa is completed, the airflow unit 30 starts providing airflow to the wafer Wa. Further, the imprint apparatus 1 moves the wafer Wa to below the imprint head 4, while providing airflow to the wafer Wa (ST12). Thereafter, the airflow unit 30 stops providing airflow to the wafer Wa, and the imprint head 4 presses the template Tp against the wafer Wa (ST13). The imprint head 4 can press the template Tp against the wafer Wa while continuously providing airflow by the airflow unit 30.

As described in the present embodiment, particles on the wafer Wa are removed after the wafer Wa is delivered to the interior of the imprint apparatus 1, and air is sprayed to the wafer Wa during the period until imprinting is completed. In other words, the imprint apparatus 1 removes particles immediately before imprinting, and covers the wafer Wa with an air curtain in order to ensure a clean space. As described above, the imprint apparatus 1 removes foreign matters adhering to the wafer Wa at the last stage before resist application, and maintains this state with the air curtain. As a result, during the period from after removing particles until imprinting, additional particles generated within the imprint apparatus 1 can be prevented from adhering to the wafer Wa. Therefore, a breakage of the template Tp can be prevented.

In manufacturing a semiconductor device (a semiconductor integrated circuit), the imprinting process performed by the imprint apparatus 1 is repeated for each layer in a wafer process, for example. Specifically, after a machined layer is formed on the wafer Wa, the imprint apparatus 1 drops a resist onto the machined layer. The imprint apparatus 1 then transfers a template pattern to the resist to form a resist pattern on the wafer Wa. An etching device then etches the machined layer by using the resist pattern as a mask. In this manner, an actual pattern corresponding to the resist pattern is formed on the wafer Wa. In manufacturing a semiconductor device, the machined-layer forming process, the imprinting process, and the etching process which are described above, and other processes are repeated for each layer.

The imprint apparatus 1 is not limited to a photo-curing type device, and can also be a thermal-curing type device. The particle removing unit 2 can also remove particles on the wafer Wa during the period from after dropping a resist until imprinting is performed. The particle removing unit 2 can be arranged at any position. The discharge unit 31 can also be arranged at any position.

The airflow unit 30 can also be arranged at any position. The airflow unit 30 can spray air in any direction. An air filling mechanism 50 can be provided instead of the airflow unit 30 in the imprint apparatus 1.

Figure 5:
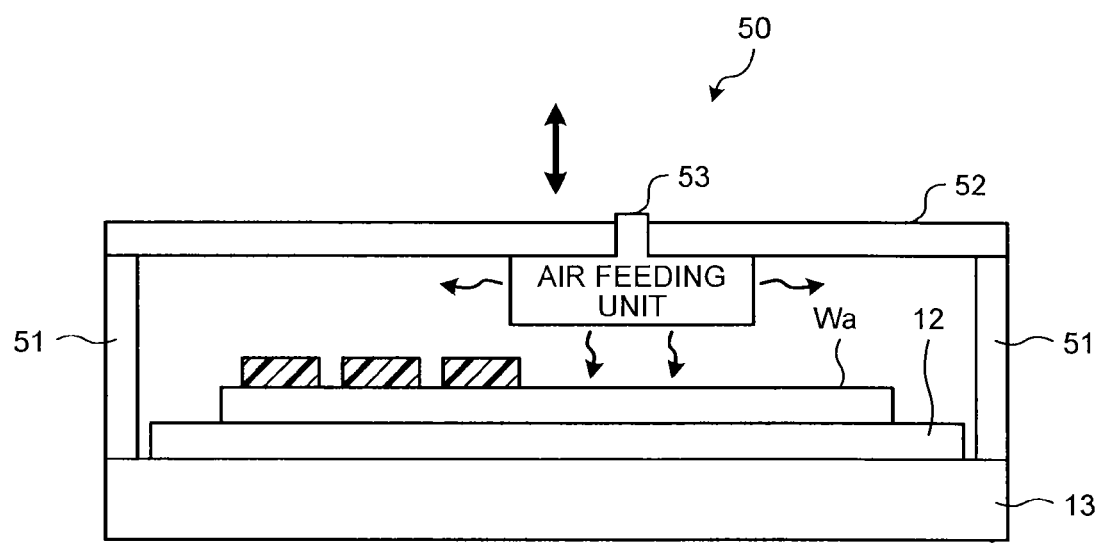
FIG. 5 illustrates a configuration of an air filling mechanism.

FIG. 5 illustrates a configuration of an air filling mechanism. The air filling mechanism 50 is arranged on the sample stage 13 to hermetically enclose the wafer Wa. The air filling mechanism 50 includes side-surface portions 51 that cover the side surfaces of the wafer Wa, a lid 52 that covers the space immediately above the wafer Wa, and an air feeding unit 53 that feeds air to the wafer Wa.

The air feeding unit 53 feeds air to a hermetically-enclosed space surrounded by the side-surface portions 51, the lid 52, and the sample stage 13 to fill the hermetically-enclosed space with the air. The air filling mechanism 50 closes the lid 52 after particles are removed from the wafer Wa, and opens the lid 52 at the time of dropping a resist. The air filling mechanism 50 closes the lid 52 after the resist is dropped onto the wafer Wa, and opens the lid 52 at the time of imprinting the template Tp.

The airflow unit 30 and the discharge unit 31 can be omitted from the imprint apparatus 1. The airflow unit 30 can omit providing airflow during the period from after removing particles from the wafer Wa until a resist is dropped onto the wafer Wa. Further, the airflow unit 30 can omit providing airflow during the period from after dropping a resist onto the wafer Wa until imprinting the template Tp on the wafer Wa. It suffices that the imprint apparatus 1 does not include the discharge unit 31. The sample stage 13 can employ a twin stage system in which two wafers Wa are held.

As described above, according to the present embodiment, particles are removed immediately before applying a resist, and therefore it is possible to press the template Tp against the wafer Wa without any particles adhering to the wafer Wa. Further, airflow is provided to the wafer Wa during the period until imprinting is performed, and therefore it is possible to press the template Tp against the wafer Wa without any particles adhering to the wafer Wa. Therefore, a breakage of the template Tp can be prevented, and an occurrence of a pattern defect can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint method comprising:
   delivering a substrate to an interior of an imprint apparatus, and placing the substrate on a sample stage;
   removing, before dropping a resist onto the substrate, minute objects adhering to a shot next-to-be-imprinted within the substrate that is placed on the sample stage;
   dropping the resist onto the shot; and
   bringing, into contact with the resist, a template that is an original plate having a concave-convex pattern to form a resist pattern on the substrate according to the concave-convex pattern.

2. The imprint method according to claim 1, wherein during a period from when the minute objects are removed until when the resist is dropped, the substrate is moved while spraying gas to the substrate.

3. The imprint method according to claim 1, wherein during a period from when the resist is dropped until when the template is brought into contact with the resist, the substrate is moved while spraying gas to the substrate.

4. The imprint method according to claim 1, wherein during a period from when the minute objects are removed until when the resist is dropped, the substrate is moved in a hermetically-enclosed state.

5. The imprint method according to claim 1, wherein during a period from when the resist is dropped until when the template is brought into contact with the resist, the substrate is moved in a hermetically-enclosed state.

6. The imprint method according to claim 1, wherein at least one of air, water, chemical solution, and static electricity is used for removing the minute objects.

7. The imprint method according to claim 2, wherein gas that is sprayed to the substrate includes at least one of rare gas, propane-based gas, methane-based gas, and nitrogen.

8. The imprint method according to claim 3, wherein gas that is sprayed to the substrate includes at least one of rare gas, propane-based gas, methane-based gas, and nitrogen.

9. The imprint method according to claim 1, wherein the minute objects are removed from the substrate when the substrate is between a position where the resist is dropped and a position where the resist pattern is formed.

10. The imprint method according to claim 2, wherein when gas is sprayed to the substrate, the gas is discharged.

11. An imprint apparatus comprising:
    a sample stage that places thereon a substrate, and that moves a substrate placed thereon;
    a removing unit that removes minute objects adhering to a shot of the substrate, on which imprinting is next performed, after placing the substrate on the sample stage and before dropping a resist onto the substrate;
    a resist dropping unit that drops a resist onto the shot; and
    an imprint head that brings a template that is an original plate having a concave-convex pattern into contact with the resist to form a resist pattern on the substrate according to the concave-convex pattern.

12. The imprint apparatus according to claim 11, further comprising a gas flow unit that sprays gas to the substrate, wherein
    the gas flow unit sprays gas to the substrate during a period from when the minute objects are removed until when the resist is dropped.

13. The imprint apparatus according to claim 11, further comprising a gas flow unit that sprays gas to the substrate, wherein
    the gas flow unit sprays gas to the substrate during a period from when the resist is dropped until when the template is brought into contact with the resist.

14. The imprint apparatus according to claim 11, further comprising a hermetically-enclosing unit that hermetically encloses the substrate, wherein
    the hermetically-enclosing unit hermetically encloses the substrate during a period from when the minute objects are removed until when the resist is dropped.

15. The imprint apparatus according to claim 11, further comprising a hermetically-enclosing unit that hermetically encloses the substrate, wherein
    the hermetically-enclosing unit hermetically encloses the substrate during a period from when the resist is dropped until when the template is brought into contact with the resist.

16. The imprint apparatus according to claim 11, wherein the removing unit uses at least one of air, water, chemical solution, and static electricity when removing the minute objects.

17. The imprint apparatus according to claim 12, wherein gas that is sprayed to the substrate includes at least one of rare gas, propane-based gas, methane-based gas, and nitrogen.

18. The imprint apparatus according to claim 13, wherein gas that is sprayed to the substrate includes at least one of rare gas, propane-based gas, methane-based gas, and nitrogen.

19. The imprint apparatus according to claim 11, wherein the removing unit is arranged between the resist dropping unit and the imprint head.

20. The imprint apparatus according to claim 12, further comprising a discharge unit that discharges gas when the gas is sprayed to the substrate.

* * * * *